United States Patent
Liu et al.

[11] Patent Number: 6,093,967
[45] Date of Patent: *Jul. 25, 2000

[54] SELF-ALIGNED SILICIDE CONTACTS FORMED FROM DEPOSITED SILICON

[75] Inventors: Yowjuang W. Liu, San Jose; Mark S. Chang, Los Altos; Michael K. Templeton, Atherton, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/992,573

[22] Filed: Dec. 17, 1997

[51] Int. Cl.⁷ .......................... H01L 23/54; H01L 21/441
[52] U.S. Cl. .......................... 257/754; 257/755; 257/382; 257/368; 257/768
[58] Field of Search .......................... 257/754, 755, 257/368, 768, 752, 382, 384

[56] References Cited

U.S. PATENT DOCUMENTS

| | | | |
|---|---|---|---|
| 4,713,356 | 12/1987 | Hiruta | 257/752 |
| 4,914,500 | 4/1990 | Liu et al. | 357/67 |
| 5,254,874 | 10/1993 | Malwah | 257/754 |
| 5,294,822 | 3/1994 | Verrett | 257/368 |
| 5,420,070 | 5/1995 | Matsuura et al. | 437/190 |
| 5,438,214 | 8/1995 | Egawa et al. | 257/754 |
| 5,635,765 | 6/1997 | Larson | 257/768 |

OTHER PUBLICATIONS

Wolf, "Silicon Processing for the VLSI ERA" vol. 2: Process Integration pp. 144–152 (1990).

*Primary Examiner*—Leo P. Picard
*Assistant Examiner*—Hung Van Duong
*Attorney, Agent, or Firm*—Foley & Lardner

[57] ABSTRACT

Self-aligned silicide contacts having a height that is at least about equal to the gate height are formed by depositing silicon over active regions of the substrate, depositing a refractory metal over the silicon, and heating the silicon and the refractory metal. The deposited silicon may be amorphous silicon in which case the deposition temperature can be as low as 580° C. If polysilicon is deposited, the deposition temperature has to be at least 620° C.

22 Claims, 5 Drawing Sheets

SELF-ALIGNED SILICIDE CONTACTS FORMED FROM DEPOSITED SILICON

BACKGROUND OF THE INVENTION

1. Field of the Invention

The invention relates generally to a process of forming contacts for an integrated circuit (IC) and more particularly to a process of forming self-aligned silicide contacts from deposited silicon.

2. Description of the Related Art

Silicides are compounds formed by a reaction of silicon with titanium, tungsten, cobalt, or other refractory metals. Silicides are formed at the surface of polysilicon gates and diffused source/drain regions to reduce the sheet resistance of the polysilicon gates and the diffused regions. A reduction in the sheet resistance is desirable because it minimizes voltage drops along interconnect lines.

Silicides can be formed from a self-aligned process. The term "self-aligned" signifies that the process does not employ additional steps for the purpose of aligning the silicides with respect to the locations of the gate, source and/or drain. The self-aligned process for forming silicides is illustrated in FIGS. 1A–1E.

FIG. 1A illustrates a semiconductor structure having a silicon substrate 10 on which a polysilicon gate 19 and diffused source and drain regions 21, 22 are formed. A silicon oxide ($SiO_2$) layer 11 functions as a field oxide that isolates this semiconductor structure from others. FIG. 1B illustrates the semiconductor structure with oxide spacers 30 formed at the sidewalls of the polysilicon gate 19.

Next, a refractory metal 40 is deposited, and the semiconductor substrate 10 is heated. The heating causes a silicide reaction wherever the refractory metal 40 is in contact with silicon. Silicides 50, 51 and 52 are thereby formed. Everywhere else, the refractory metal 40 remains unreacted. The unreacted metal is selectively removed through the use of an etchant that does not attack the silicides 50, 51 and 52, the semiconductor substrate 10, or the $SiO_2$ layer 11 (FIG. 1D).

A dielectric layer 60 is deposited onto the structure of FIG. 1D and contact holes 61, 62 are opened in the dielectric layer 60 down to the silicides 51, 52. Metal is then deposited into the contact holes to make contact with the silicides 51, 52 (FIG. 1E).

In forming the silicides 51, 52 by the above-described process, the silicon in the source and drain regions 21, 22 are consumed. If too much silicon is consumed from the source and drain regions 21, 22, the junctions formed in these regions will be destroyed. Therefore, the silicides 51, 52 are limited in thickness.

Furthermore, the above-described process is self-aligned only with respect to the silicides 51, 52. The metal contacts that are formed in the contact holes 61, 62 are not self-aligned. Therefore, additional alignment steps are necessary to assure that the contact holes 61, 62 are positioned correctly with respect to the locations of the gate, source, and drain.

SUMMARY OF THE INVENTION

An object of this invention is to provide a self-aligned process for forming silicide contacts.

Another object of this invention is to provide a method of planarizing a semiconductor structure using self-aligned silicide contacts.

Still another object of this invention is to provide self-aligned silicide contacts that are not limited in thickness.

Still another object of this invention is to provide self-aligned silicide contacts that do not require an alignment with respect to the locations of the gate, source, and drain.

The above and other objects of the invention are accomplished by depositing silicon over active regions of the substrate, depositing a refractory metal over the silicon, and heating the silicon and the refractory metal to form silicide contacts over the active regions. The deposited silicon may be amorphous silicon in which case the deposition temperature can be as low as 580° C. If polysilicon is deposited instead, the deposition temperature has to be at least 620° C.

With the process according to the invention, a self-aligned silicide contact having a height that is at least about equal to the gate height can be formed on either side of the gate. Oxide spacers are also formed on either side of the gate between the gate and the self-aligned silicide contacts. The gate may be a stacked type including a first polysilicon gate and a second polysilicon gate disposed above the first polysilicon gate.

With the invention, the thickness of the self-aligned silicide contacts are not limited because the silicon that is used for forming the self-aligned silicide contacts are not supplied by the source and drain regions. Therefore, even when self-aligned silicide contacts of relatively large thicknesses are formed, the junctions formed at the source and drain regions will not be destroyed.

Furthermore, the invention provides a complete self-aligned process. This is because the silicide contacts are formed to have a height that is at least about equal to the gate height. As a result, conductive lines that interconnect a group of source or drain regions can be formed directly on top of these silicide contacts. Contact holes, although they can be optionally provided, are no longer required.

The self-aligned silicide contacts according to the invention also provide planarization by effectively elevating the source and drain regions to be level with the gate region. This permits a more uniform and compact multi-layer designs with improved manufacturability and reduced costs.

Additional objects, features and advantages of the invention will be set forth in the description of preferred embodiments which follows.

BRIEF DESCRIPTION OF THE DRAWINGS

The invention is described in detail herein with reference to the drawings in which.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENT

Figure 2A:
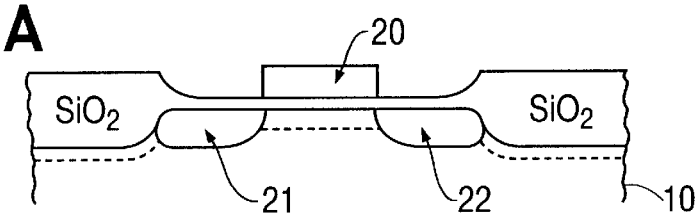
FIGS. 2A–2F illustrate a process for forming self-aligned silicide contacts according to a first embodiment of the invention.
Figure 2B:
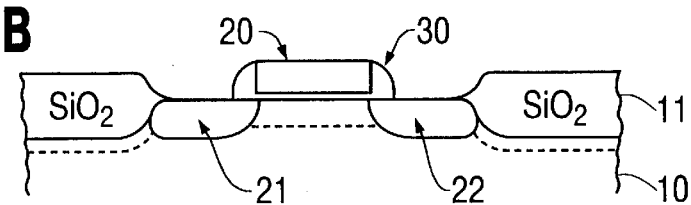

FIGS. 2A–2F illustrate a process for forming self-aligned silicide contacts according to a first embodiment of the invention. FIG. 2A illustrates a semiconductor structure having a silicon substrate 10 on which a polysilicon gate 20 and diffused source and drain regions 21, 22 are formed. A silicon oxide (SiO₂) layer 11 functions as a field oxide that isolates this semiconductor structure from others. FIG. 2B illustrates the semiconductor structure with oxide spacers 30 formed at the sidewalls of the polysilicon gate 20.

Figure 6:
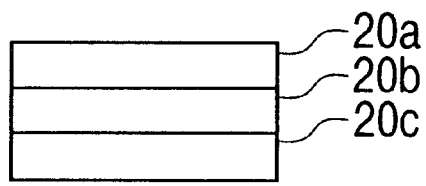
FIG. 6 illustrates in detail the structure of the polysilicon gate used with the self-aligned silicide contacts according to the invention.

The polysilicon gate 20 has three layers. The three layers are illustrated in FIG. 6, and include an oxide or nitride layer 20a, a tungsten silicide (WSi₂) layer 20b and a polysilicon layer 20c. The oxide or nitride layer 20a, and the oxide spacers 30 protect the conductive portions of the gate 20, i.e., the WSi₂ layer 20b and the polysilicon layer 20c from conduction with the active regions.

Figure 2C:
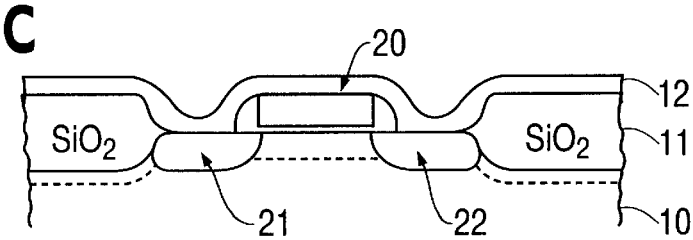

As shown in FIG. 2C, a silicon layer 12 is deposited on top of the oxide layer 11, the gate 20, and the source and drain regions 21, 22. The deposition is carried out by chemical vapor deposition (CVD). Preferably, the deposited silicon is amorphous silicon and the deposition temperature is about 580° C. or higher. Polysilicon may be used instead of amorphous silicon, in which case the deposition temperature has to be at least about 620° C.

Figure 2D:
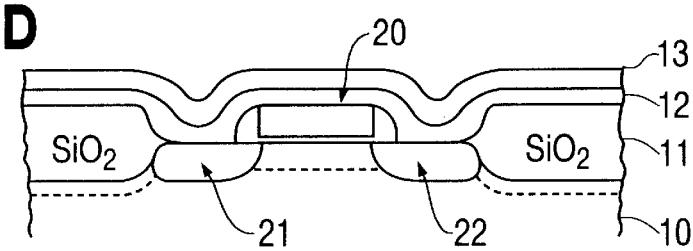
Figure 2E:
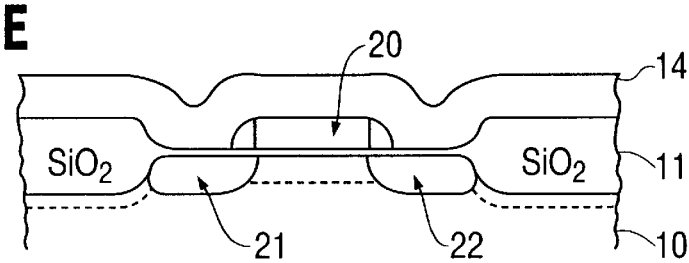
Figure 2F:
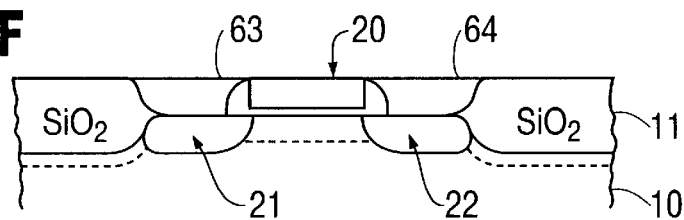
Figure 3A:
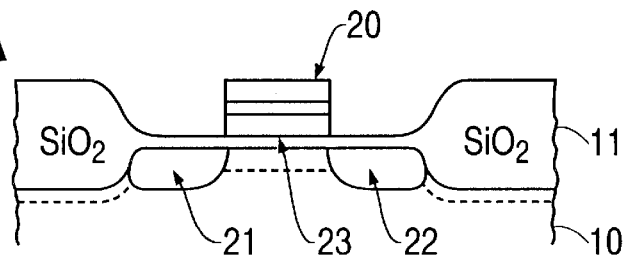
FIGS. 3A–3F illustrate a process for forming self-aligned silicide contacts according to a second embodiment of the invention.
Figure 3B:
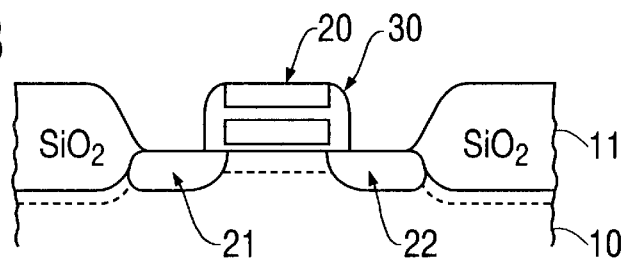
Figure 3C:
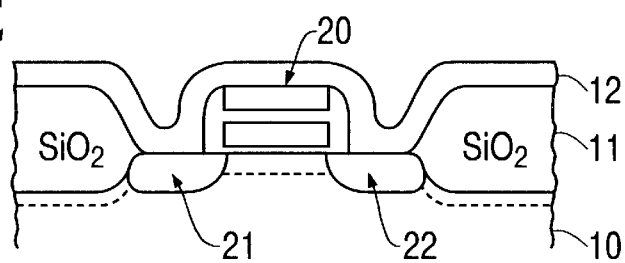
Figure 3D:
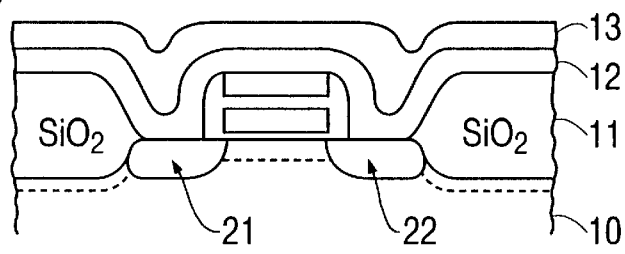
Figure 3E:
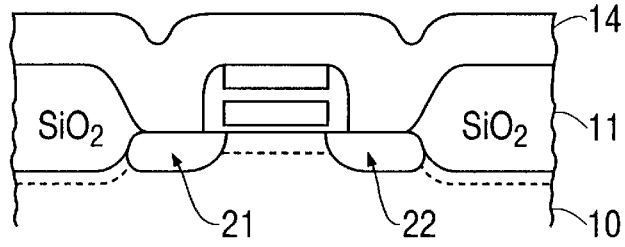
Figure 3F:
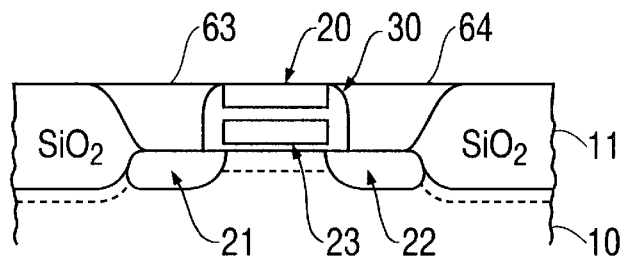

Afterwards, a refractory metal layer 13 is deposited on top of the silicon layer 12 using evaporation, sputtering, or CVD techniques (FIG. 2D). The refractory metal layer may comprise any of the refractory metals but is preferably titanium (Ti), cobalt (Co), or tungsten (W). The resulting structure is then heated to a temperature between 600 and 1000° C. depending on the choice of metal. The heating causes a reaction of the silicon layer 12 with the refractory metal layer 13, and a silicide layer 14, illustrated in FIG. 2E, is thereby formed.

The silicide layer 14 is then polished until the gate 20 is exposed. The resulting structure, illustrated in FIG. 2F, includes the gate 20, the oxide spacers 30 formed on either side of the gate 20, the self-aligned silicide contacts 63, 64 formed above the source and drain regions 21, 22, and the field oxide formed from the SiO₂ layer 11.

Figure 1A:
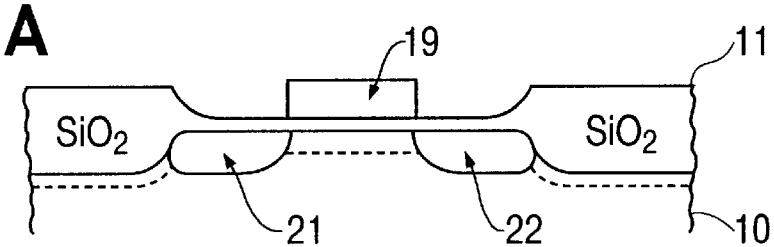
FIGS. 1A–1E illustrate a conventional process for forming self-aligned silicides.
Figure 1B:
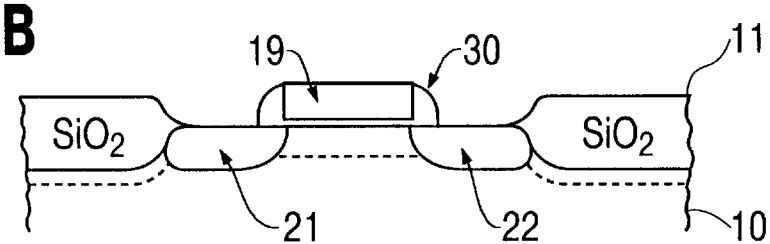
Figure 1C:
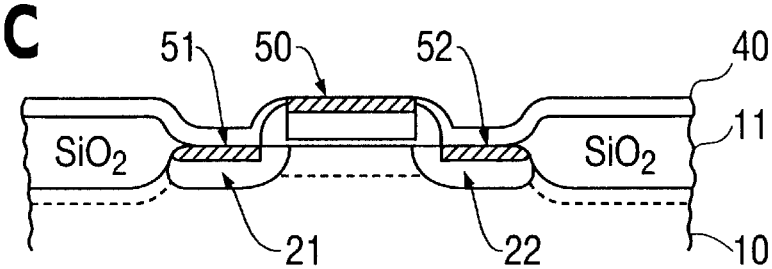
Figure 1D:
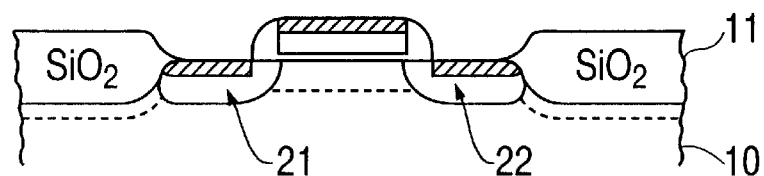
Figure 1E:
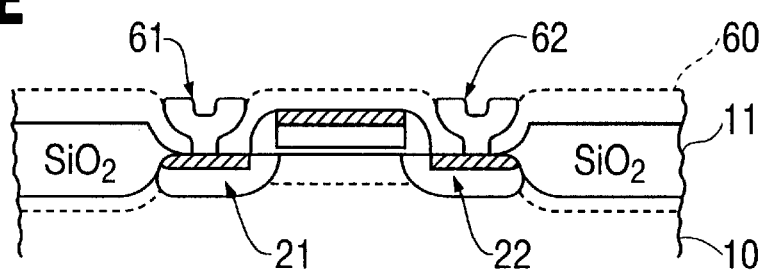

The self-aligned silicide contacts 63, 64 have heights that are substantially equal to the height of the gate 20. As a result, conductive lines for interconnecting a group of source or drain regions can be formed directly on top of the self-aligned silicide contacts 63, 64. There is no need for aligning contact holes as per FIG. 1E.

FIGS. 3A–3F illustrate a process for forming self-aligned silicide contacts according to a second embodiment of the invention. In the process according to the second embodiment, self-aligned silicide contacts 63, 64 are formed for a semiconductor structure including a stacked gate structure. The stacked gate structure includes a first gate 20 and a second gate 23. The first gate 20 has the structure illustrated in FIG. 6 and the second gate 23 has just a single polysilicon layer. Except for the gate structure, the process according to the second embodiment is the same as the process according to the first embodiment.

Figure 4A:
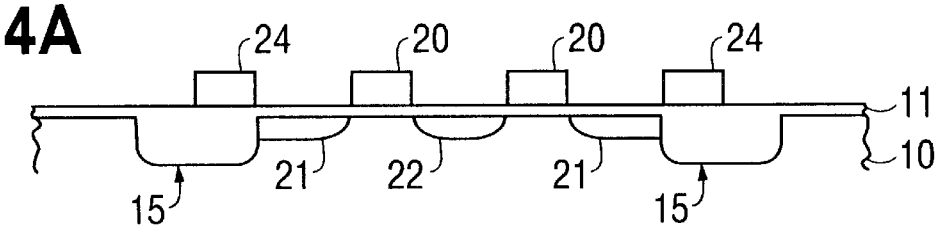
FIGS. 4A–4F illustrate a process for forming self-aligned silicide contacts according to a third embodiment of the invention.
Figure 4B:
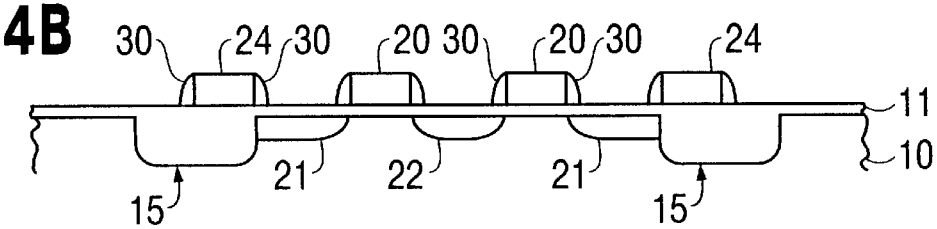

FIGS. 4A–4F illustrate a process for forming self-aligned silicide contacts according to a third embodiment of the invention. FIG. 4A illustrates a semiconductor structure having a silicon substrate 10 on which a pair of polysilicon gates 20, a pair of dummy polysilicon gates 24, isolation trenches 15, and diffused source and drain regions 21, 22 are formed. A silicon oxide (SiO₂) layer 11 fills the isolation trenches 15 and functions as a field oxide that isolates this semiconductor structure from others. FIG. 4B illustrates the semiconductor structure with oxide spacers 30 formed at the sidewalls of the polysilicon gates 20, 24.

Each of the polysilicon gates 20, 24 has three layers. The three layers are illustrated in FIG. 6, and include an oxide or nitride layer 20a, a tungsten silicide (WSi₂) layer 20b and a polysilicon layer 20c. The oxide or nitride layer 20a, and the oxide spacers 30 protect the conductive portions of the gate 20, i.e., the WSi₂ layer 20b and the polysilicon layer 20c from conduction with the active regions.

Figure 4C:
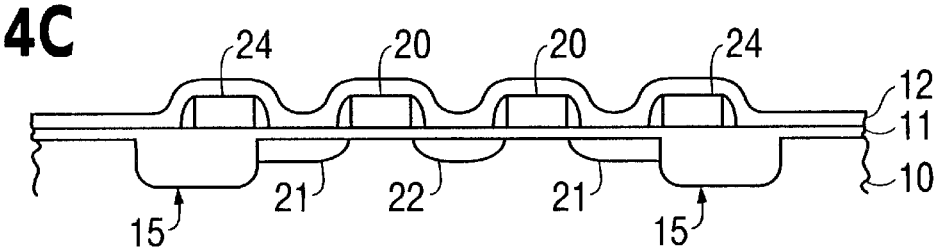

As shown in FIG. 4C, a silicon layer 12 is deposited on top of the oxide layer 11, the gates 20, 24, and the source and drain regions 21, 22. The deposition is carried out by chemical vapor deposition (CVD). Preferably, the deposited silicon is amorphous silicon and the deposition temperature is about 580° C. or higher. Polysilicon may be used instead of amorphous silicon, in which case the deposition temperature has to be at least about 620° C.

The deposited silicon 12 is then removed selectively by the steps of (i) polishing until the upper surfaces of the gates 20, 24 are exposed, (ii) masking the silicon that is between the dummy polysilicon gates 24, inclusive of the dummy polysilicon gates 24, and (iii) etching away the exposed portions of the deposited silicon 12. The resulting structure is illustrated in FIG. 4D.

Figure 4D:
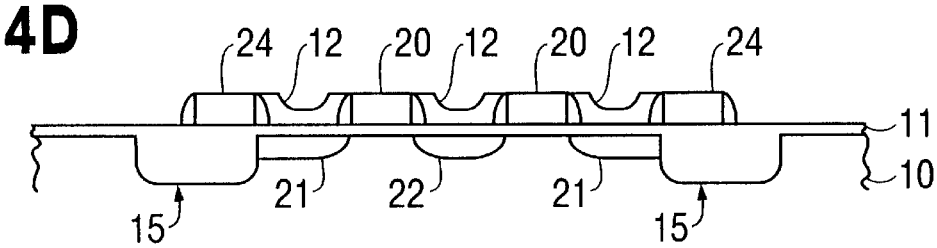
Figure 4E:
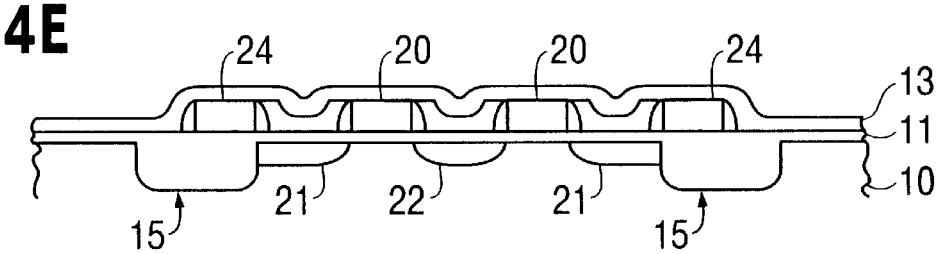

Afterwards, a refractory metal layer 13 is deposited on top of the structure illustrated in FIG. 4D using evaporation, sputtering, or CVD techniques (FIG. 4E). The refractory metal layer may comprise any of the refractory metals but is preferably titanium (Ti), cobalt (Co), or tungsten (W). The resulting structure is then heated to a temperature between 600 and 1000° C. depending on the choice of metal. The heating causes a silicide reaction between the remaining silicon layer 12 and the refractory metal layer 13 to form silicides in the area above the source and drain regions 21, 22.

Figure 4F:
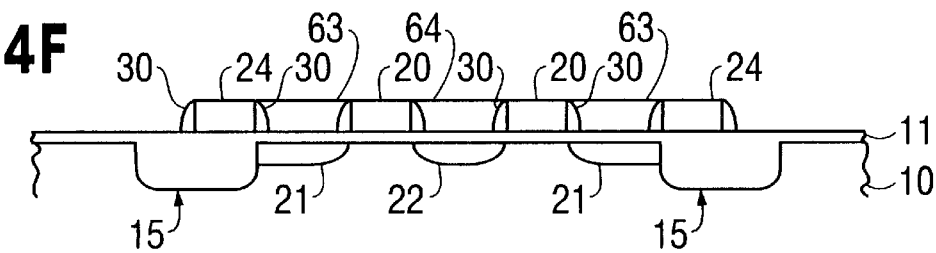

After polishing until the upper surfaces of the gates 20, 24 are exposed, and removing the unreacted metal by a wet etch, the structure illustrated in FIG. 4F results. This structure includes the polysilicon gates 20, the dummy polysilicon gates 24, the oxide spacers 30 formed on either side of the gates 20, 24, the self-aligned silicide contacts 63, 64 formed above the source and drain regions 21, 22, and the isolation trenches 15 filled with the SiO₂ from the layer 11.

The self-aligned silicide contacts 63, 64 have heights that are substantially equal to the height of the gates 20, 24. As a result, conductive lines for interconnecting a group of source or drain regions can be formed directly on top of the self-aligned silicide contacts 63, 64.

Figure 5A:
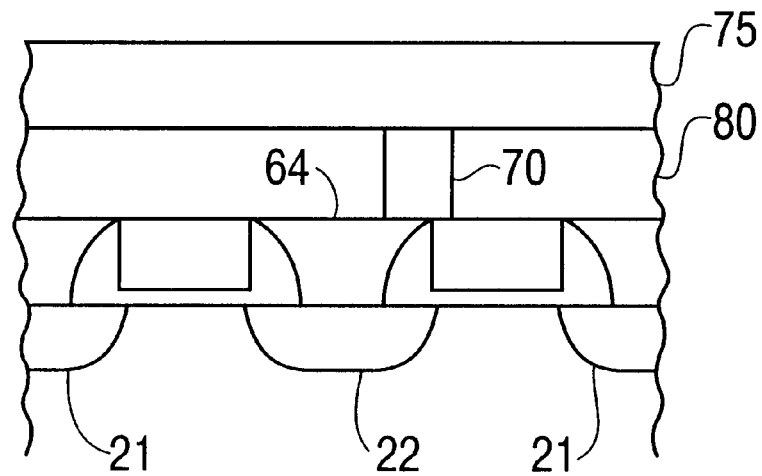
FIGS. 5A and 5B illustrate two alternative ways of interconnecting a group of source or drain regions using the self-aligned silicide contacts according to the invention.
Figure 5B:
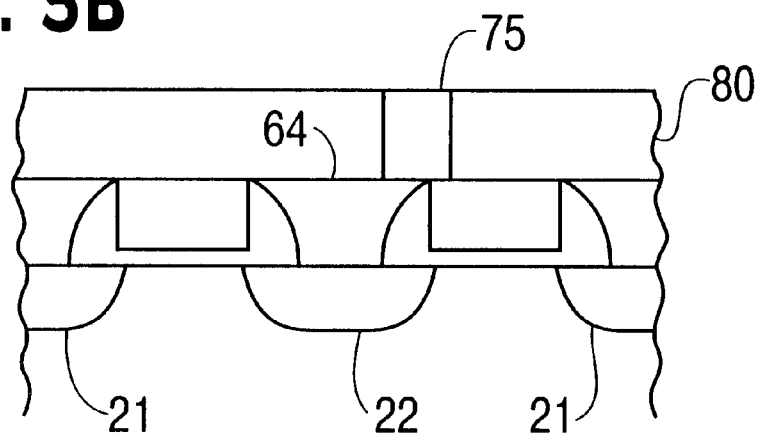

FIGS. 5A and 5B illustrate two alternative ways of interconnecting a group of source or drain regions using the self-aligned silicide contacts 63, 64. In FIG. 5A, a metal contact 70 is formed through an inter-level dielectric (ILD) layer 80 to connect a drain region 22 with a metal line 75 through the self-aligned silicide contact 64. Each of the source and drain regions has a similarly provided metal contact, and metal lines operate to interconnect specified groups of source and drain regions.

However, metal contacts are not necessary to interconnect a group of source or drain regions. For example, in FIG. 5B, a metal line 75, extending perpendicular to the plane of the illustration, is formed directly on top of the self-aligned silicide contact 64 to interconnect a group of drains disposed along this direction. This interconnection method is preferred because it is not necessary to form metal contact holes through the ILD layer 80.

In FIGS. 5A and 5B, the metal contact 70 and the metal line 75 are misaligned. The conventional method does not permit such a misalignment, because the contact hole for the metal contact 61 or 62 needs to be formed deep enough to reach the level of the silicides 21, 22 (see FIG. 1E). If a contact hole, that is misaligned to the extent shown in FIGS. 5A and 5B, is formed to a sufficient depth in the conventional method, the metal contact 61 or 62 would be in contact with the conductive part of the gate 20, and a short would result.

In each of the above-described three embodiments, the silicon depositing step may be carried out in multiple steps. For example, there may be one step of depositing silicon just before the refractory metal depositing step and another step of depositing silicon directly after the refractory metal depositing step.

While particular embodiments according to the invention have been illustrated and described above, it will be clear that the invention can take a variety of forms and embodiments within the scope of the appended claims.

We claim:

1. A semiconductor structure comprising:
    a substrate including an active region contained wholly therein;
    a gate disposed above the substrate on one side of the active region;
    a pair of spacers formed on sidewalls of the gate; and
    a silicide contact disposed above the active region and in contact with the active region and one of the spacers, and having an upper surface that consists essentially of silicide and is at about the same height as an upper surface of the gate.

2. The semiconductor structure as recited in claim 1, further comprising a conductive line disposed above the silicide contact with no intervening layer therebetween.

3. The semiconductor structure as recited in claim 1, wherein the silicide contact extends from the top of the substrate to at least about the height of the top of said gate.

4. The semiconductor structure as recited in claim 2, wherein the conductive line is disposed partially above the silicide contact and partially above the gate.

5. The semiconductor structure as recited in claim 4, wherein the gate includes an upper layer of oxide to insulate a conductive portion thereof from the conductive line.

6. The semiconductor structure as recited in claim 4, wherein the gate includes an upper layer of nitride to insulate a conductive portion thereof from the conductive line.

7. The semiconductor structure as recited in claim 5, wherein the gate includes layers of $WSi_2$, and polysilicon beneath the upper layer of oxide.

8. The semiconductor structure as recited in claim 5, wherein the gate has a stacked structure and includes first and second polysilicon gates.

9. The semiconductor structure as recited in claim 6, wherein the gate includes layers of $WSi_2$, and polysilicon beneath the upper layer of nitride.

10. The semiconductor structure as recited in claim 9, wherein the gate has a stacked structure and includes first and second polysilicon gates.

11. The semiconductor structure as recited in claim 3, wherein the substrate includes a second active region and the gate is disposed on the substrate between the active regions.

12. The semiconductor structure as recited in claim 11, further comprising a second silicide contact disposed on top of the second active region and having a height that is at least about equal to the gate height.

13. A semiconductor structure comprising:
    a substrate;
    a gate above the substrate and having spacers formed on sidewalls thereof; and
    a silicide layer above the substrate adjacent to the gate and in contact with one of the spacers and having a thickness that is about equal to a distance from a top surface of the substrate to a top surface of the gate.

14. The semiconductor structure as recited in claim 13, wherein the silicide layer comprises silicide contacts.

15. The semiconductor structure as recited in claim 13, further comprising a conductive line disposed above the silicide layer with no intervening layer therebetween,
    wherein the conductive line is disposed partially above the silicide layer and partially above the gate and the gate includes an upper insulating layer to insulate a conductive portion thereof from the conductive line.

16. The semiconductor structure as recited in claim 14, wherein the substrate includes active regions and the silicide contacts are self-aligned with respect to the gate region and the active regions.

17. The semiconductor structure as recited in claim 16, wherein the silicide contacts are in direct contact with the active regions.

18. A semiconductor device having active regions and gate regions defined on a substrate comprising:
    a plurality of gates, each having spacers formed on sidewalls thereof; and
    a plurality of self-aligned silicide contacts respectively disposed over the active regions and adjacent to and in contact with one of the spacers formed on the sidewalls of the gates, the silicide contacts consisting essentially of silicide and having a thickness that is about equal to a distance from a top surface of the substrate to a top surface of an adjacent gate and a width that is substantially as wide as the underlying active region.

19. The semiconductor structure as recited in claim 18, wherein the silicide contact extends down to and contacts with the corresponding active region.

20. The semiconductor structure as recited in claim 18, further comprising a conductive line disposed above at least one of the silicide contacts with no intervening layer therebetween,
    wherein the conductive line is disposed partially above said at least one of the silicide contacts and partially above an adjacent gate and the adjacent gate includes an upper insulating layer to insulate a conductive portion thereof from the conductive line.

21. The semiconductor structure as recited in claim 19, wherein the gates have a uniform height and the silicide contacts also have a uniform height that is substantially equal to that of the gates, the tops of said gates and silicide contacts being coplanar.

22. The semiconductor structure as recited in claim 21, wherein the substrate includes an isolation trench and one of the gates is a dummy gate disposed on top of the isolation trench.

* * * * *